US012635533B2

(12) United States Patent
Tanabiki

(10) Patent No.: US 12,635,533 B2
(45) Date of Patent: May 19, 2026

(54) SEMICONDUCTOR DEVICE AND METHOD FOR MANUFACTURING SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Kyo Tanabiki, Himeji Hyogo (JP)

(73) Assignees: Kabushiki Kaisha Toshiba; Toshiba Electronic Devices & Storage Corporation

( * ) Notice: Subject to any disclaimer, the term of this patent is extended or adjusted under 35 U.S.C. 154(b) by 482 days.

(21) Appl. No.: 18/177,739

(22) Filed: Mar. 2, 2023

(65) Prior Publication Data

US 2023/0411337 A1 Dec. 21, 2023

(30) Foreign Application Priority Data

Jun. 8, 2022 (JP) ................................. 2022-092691

(51) Int. Cl.
H01L 23/00 (2006.01)
H01L 23/495 (2006.01)

(52) U.S. Cl.
CPC ........ H01L 24/40 (2013.01); H01L 23/49513 (2013.01); H01L 24/32 (2013.01); (Continued)

(58) Field of Classification Search
CPC ... H01L 24/40; H01L 23/49513; H01L 24/32; H01L 24/37; H01L 24/73; H01L 24/83; (Continued)

(56) References Cited

U.S. PATENT DOCUMENTS

| | | | | |
|---|---|---|---|---|
| 7,679,173 B2 * | 3/2010 | Uno | ........................ | H01L 24/84 |
| | | | | 257/E23.079 |
| 7,709,938 B2 * | 5/2010 | Laska | ..................... | H01L 24/48 |
| | | | | 257/784 |

(Continued)

FOREIGN PATENT DOCUMENTS

| | | |
|---|---|---|
| JP | H06232317 A | 8/1994 |
| JP | 2001358280 A | 12/2001 |

(Continued)

OTHER PUBLICATIONS

Japanese Office Action dated Nov. 4, 2025, mailed in counterpart Japanese Application No. 2022-092691, 16 pages.

*Primary Examiner* — Vu A Vu
(74) *Attorney, Agent, or Firm* — Kim & Stewart LLP

(57) ABSTRACT

According to one embodiment, a semiconductor device includes a bed portion, a semiconductor element, and a connector. The semiconductor element has a first electrode electrically connected to the bed portion and a second electrode facing away from the bed portion. The connector includes a first connection portion with a first surface electrically connected to the second electrode. The first surface is inclined in a direction from an outer edge portion of the first surface toward a center of the first surface. A lead portion of the connector is electrically connected to the first connection portion and spaced away from the bed portion.

17 Claims, 16 Drawing Sheets

(52) U.S. Cl.
 CPC .............. *H01L 24/37* (2013.01); *H01L 24/73*
 (2013.01); *H01L 24/83* (2013.01); *H01L 24/84*
 (2013.01); *H01L 24/92* (2013.01); *H01L*
 *2224/32245* (2013.01); *H01L 2224/37013*
 (2013.01); *H01L 2224/40151* (2013.01); *H01L*
 *2224/73263* (2013.01); *H01L 2224/83815*
 (2013.01); *H01L 2224/84815* (2013.01); *H01L*
 *2224/9221* (2013.01)

(58) Field of Classification Search
 CPC ..................... H01L 24/84; H01L 24/92; H01L
 2224/32245; H01L 2224/37013; H01L
 2224/40151; H01L 2224/73263; H01L
 2224/83815; H01L 2224/84815; H01L
 2224/9221; H01L 24/29; H01L 23/49548;
 H01L 23/49562
 USPC ......................................................... 257/676
 See application file for complete search history.

(56) References Cited

U.S. PATENT DOCUMENTS

| | | | | |
|---|---|---|---|---|
| 7,745,253 | B2 * | 6/2010 | Luechinger ............. | H01L 24/48 |
| | | | | 438/106 |
| 8,222,651 | B2 * | 7/2012 | Kanazawa ............. | H01L 24/06 |
| | | | | 257/88 |
| 8,253,247 | B2 * | 8/2012 | Numata .................. | H01L 24/48 |
| | | | | 257/734 |
| 9,111,922 | B2 * | 8/2015 | Andou .................... | H01L 24/97 |
| 9,640,465 | B2 * | 5/2017 | Arokiasamy ..... | H01L 23/49541 |
| 10,910,294 | B2 * | 2/2021 | Nishikawa .......... | H01L 23/3114 |
| 11,056,458 | B2 * | 7/2021 | Kessler .................. | H01L 24/24 |
| 11,094,638 | B2 * | 8/2021 | Yamada ............. | H01L 23/5386 |
| 11,545,446 | B2 * | 1/2023 | Abe .................... | H01L 23/3142 |
| 2004/0217488 | A1 * | 11/2004 | Luechinger .......... | B23K 20/008 |
| | | | | 257/784 |
| 2013/0009295 | A1 | 1/2013 | Otremba | |
| 2015/0206830 | A1 * | 7/2015 | Takada .................. | H01L 21/561 |
| | | | | 257/676 |
| 2016/0225701 | A1 | 8/2016 | Tanaka | |
| 2016/0358843 | A1 | 12/2016 | Arokiasamy | |

FOREIGN PATENT DOCUMENTS

| | | |
|---|---|---|
| JP | 2007335538 A | 12/2007 |
| JP | 2012125786 A | 7/2012 |
| JP | 2016143693 A | 8/2016 |
| JP | 2019186431 A | 10/2019 |

* cited by examiner

*FIG. 2*

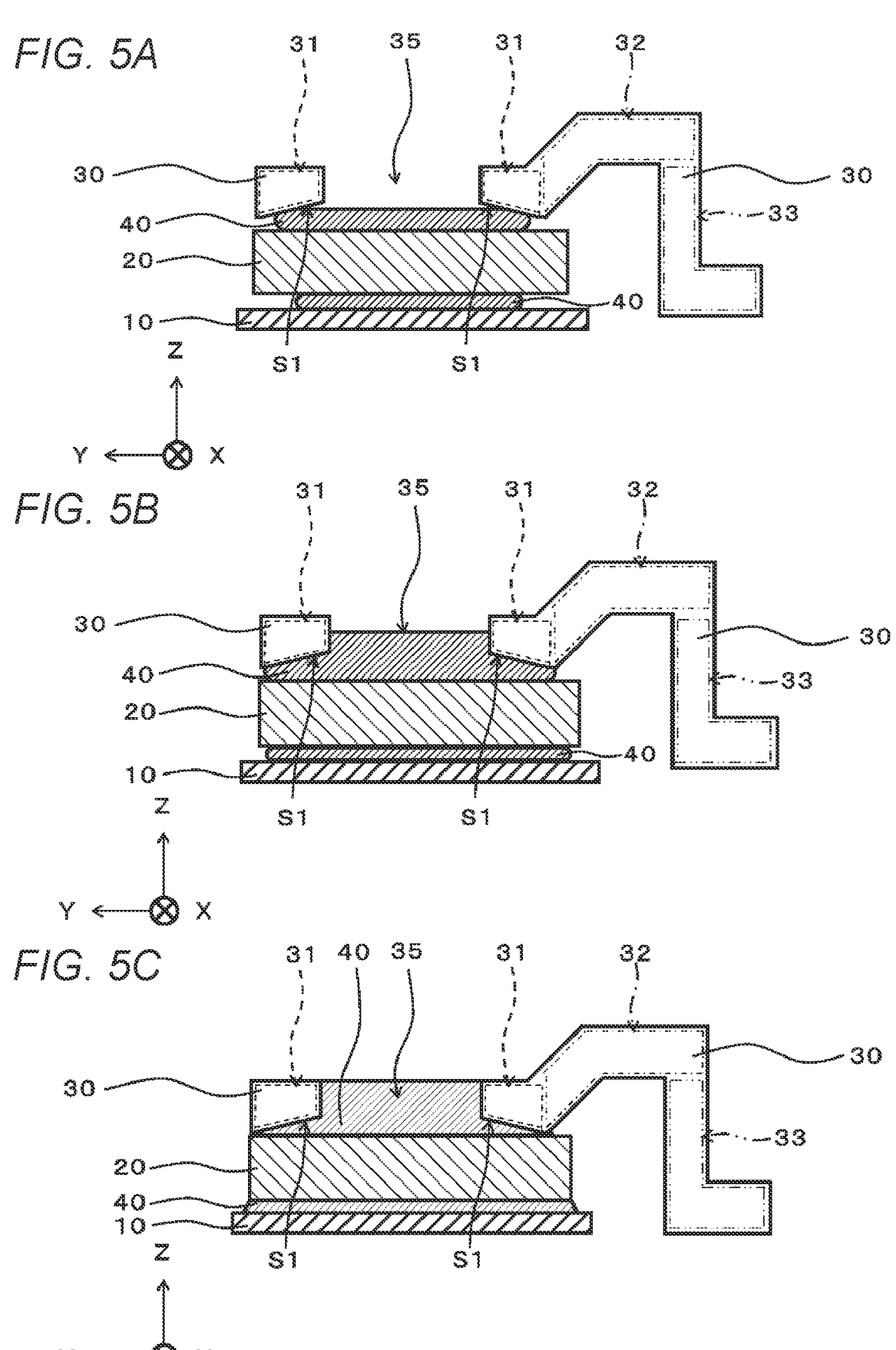

*FIG. 10*

*FIG. 16*
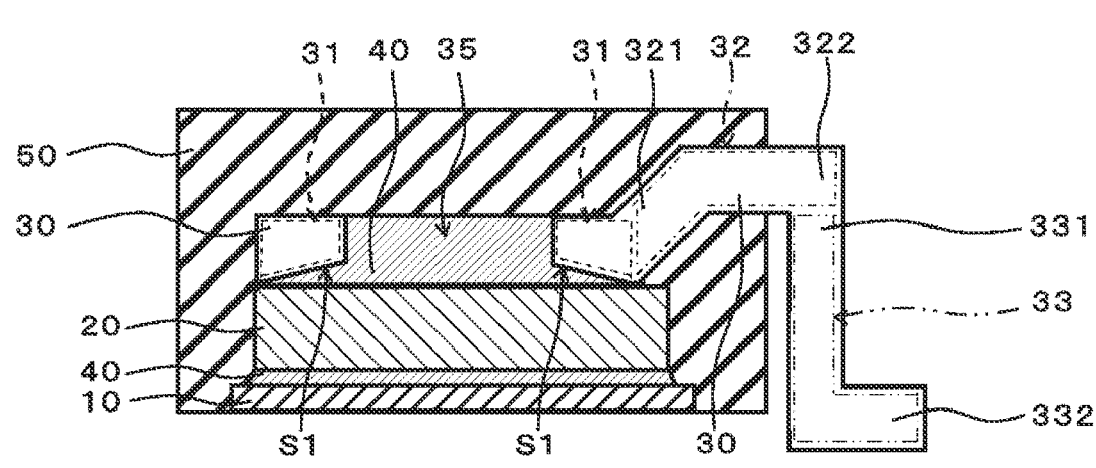
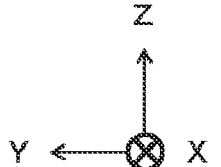
*FIG. 17*
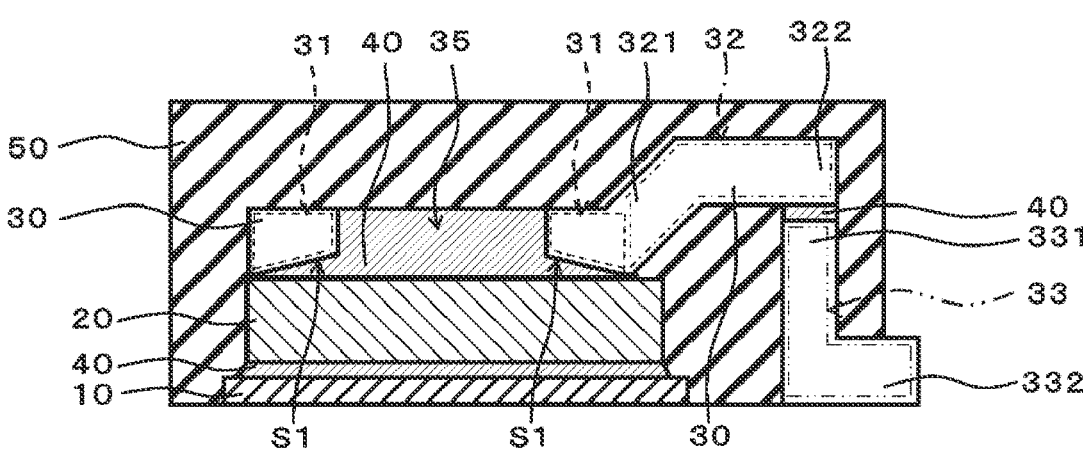
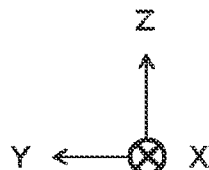

FIG. 19

SEMICONDUCTOR DEVICE AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2022-092691, filed Jun. 8, 2022, the entire contents of which are incorporated herein by reference.

FIELD

Embodiments described herein relate generally to a semiconductor device and a method for manufacturing a semiconductor device.

BACKGROUND

A semiconductor device that is encapsulated by a resin or the like is known. A semiconductor device encapsulated by resin can be configured as including a bed portion on which a semiconductor element is placed, a connector component electrically connected to electrodes of the semiconductor element, and the encapsulating resin covering at least parts of the semiconductor element, the bed portion, and the connector. The connector component usually has a lead portion that serves as an external terminal, thus a part of the lead portion is exposed from the resin to enable electrical connections to an external electrode.

BRIEF DESCRIPTION OF THE DRAWINGS

FIG. 2 is a cross-sectional view taken along line A-A' illustrated in FIG. 1A.

FIGS. 5A to 5C illustrate aspects of a method for manufacturing a semiconductor device according to a first embodiment.

FIG. 10 illustrates a semiconductor device according to a first embodiment during the manufacturing process.

FIG. 16 is a cross-sectional view of a semiconductor device according to a modification of a first embodiment.

FIG. 17 is a cross-sectional view of a semiconductor device according to a modification of a first embodiment.

FIG. 19 is a cross-sectional view of a first connection portion according to a modification of a first embodiment.

DETAILED DESCRIPTION

Figure 1A:
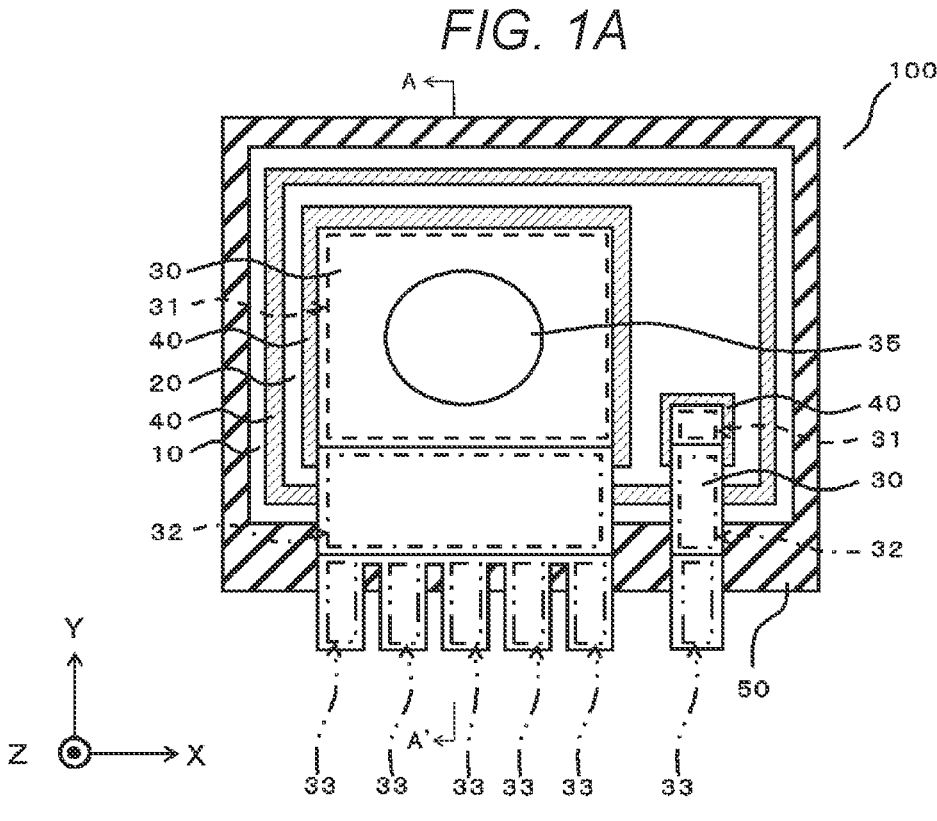
FIG. 1A is a plan view of a front surface of a semiconductor device 100 according to a first embodiment.

In general, according to one embodiment, a semiconductor device includes According to one embodiment, a semiconductor device includes a bed portion, a semiconductor element, and a connector. The semiconductor element has a first electrode electrically connected to the bed portion and a second electrode on a side of the semiconductor opposite of the first electrode in a first direction. The connector includes a first connection portion with a first surface electrically connected to the second electrode. The first surface is inclined in a direction from an outer edge portion of the first surface toward a center of the first surface. A lead portion (lead-out portion) of the connector is electrically connected to the first connection portion but spaced away from the bed portion in a second direction intersecting the first direction.

According to another embodiment, a semiconductor device includes a bed portion, a semiconductor element, and a connector. The semiconductor element includes a first electrode electrically connected to the bed portion and a second electrode provided on a surface opposite of the first electrode in a first direction. The connector includes a first connection portion with a first surface electrically connected to the second electrode and a groove portion provided on the first surface extending in a direction from an outer edge portion of the first surface toward a center of the first surface. The connector also includes a lead portion electrically connected to the first connection portion and separated from the bed portion in a second direction intersecting the first.

According to still another embodiment, a method for manufacturing a semiconductor device includes connecting a semiconductor element to a bed portion via joint material (e.g., solder or the like), connecting the connector to the second electrode via joint material, and heating the bed portion, the first connection portion, the joint material, and the semiconductor element to fix the semiconductor element to the bed portion and the first connection portion.

Hereinafter, certain example embodiments of the present disclosure will be described with reference to the drawings. In descriptions, elements that are the same or substantially so are denoted by the same reference signs throughout. The proportions, dimensions, and the like of components in the drawings are not necessarily those of an actual implementation of an embodiment. The presented example embodiments are not intended to limit the scope of the present disclosure.

First Embodiment (Structure of Semiconductor Device 100)

Figure 1B:
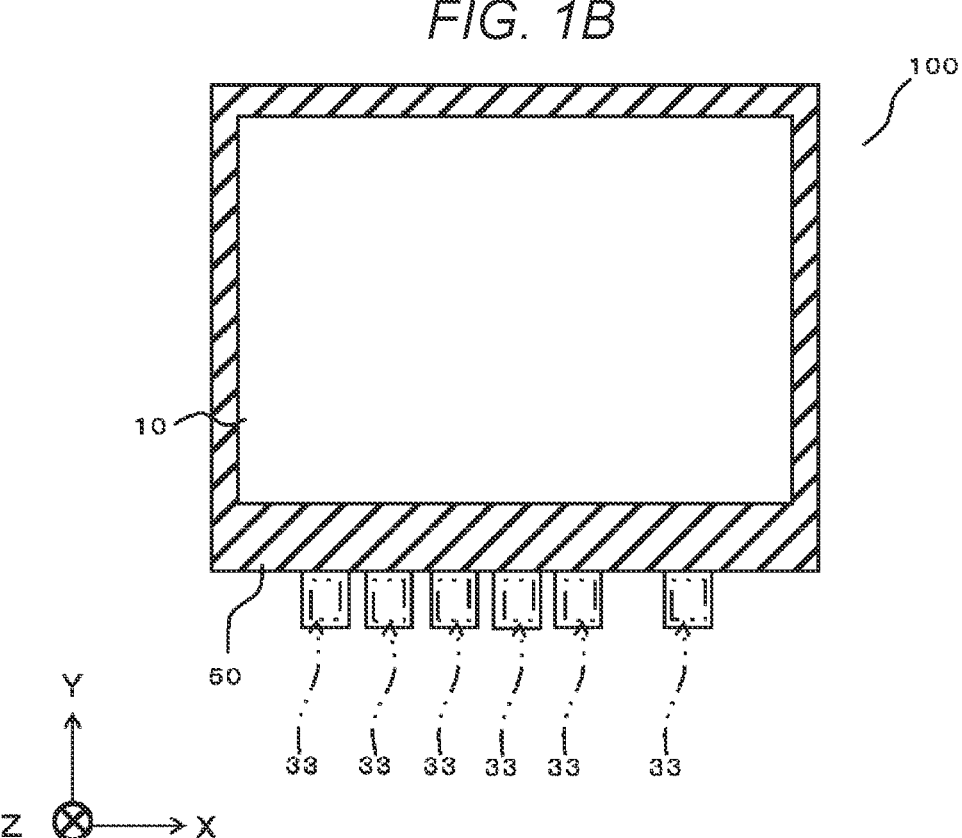
FIG. 1B is a plan view of a rear surface of the semiconductor device 100 according to a first embodiment.
Figure 2:
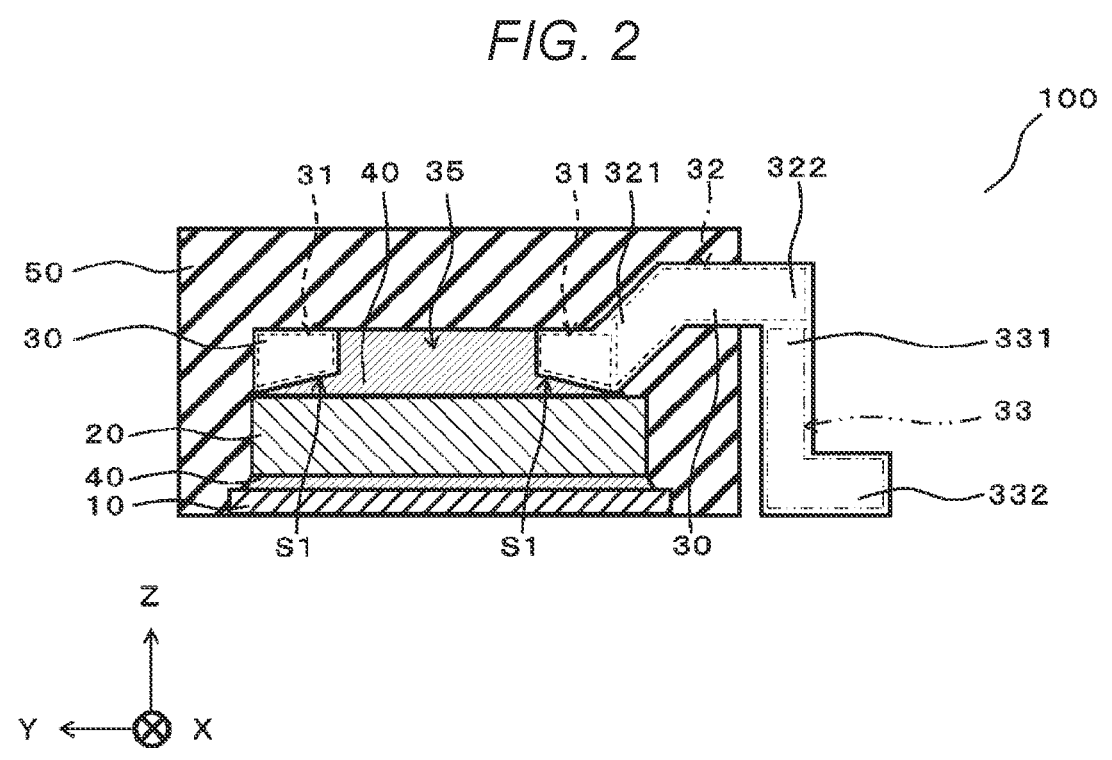

A semiconductor device 100 according to a first embodiment will be described with reference to FIGS. 1A, 1B, and 2. FIG. 1A is a plan view of a front surface of the semiconductor device 100 according to the first embodiment and FIG. 1B is a plan view of a rear surface of the semiconductor device 100 according to the first embodiment. FIG. 2 is a cross-sectional view taken along line A-A' illustrated in FIG. 1A. In FIG. 1A, portions of a resin 50 are illustrated transparently to permit viewing of other aspects.

The semiconductor device 100 has a bed portion 10, a semiconductor element 20, a connector 30, a joint material 40, and a resin 50.

In the following description, a direction from the bed portion 10 toward the semiconductor element 20 is a Z direction. A direction orthogonal to the Z direction is an X direction, and a direction orthogonal to the X and Z directions is a Y direction. FIGS. 1A and 1B are plan views of the semiconductor device 100 in an X-Y plane and FIG. 2 is a cross-sectional view of the semiconductor device 100 in a Y-Z plane.

The bed portion 10 is, for example, rectangular. The bed portion 10 is formed from a metal. The bed portion 10 is formed from, for example, copper (Cu) or a copper alloy.

Figure 15:
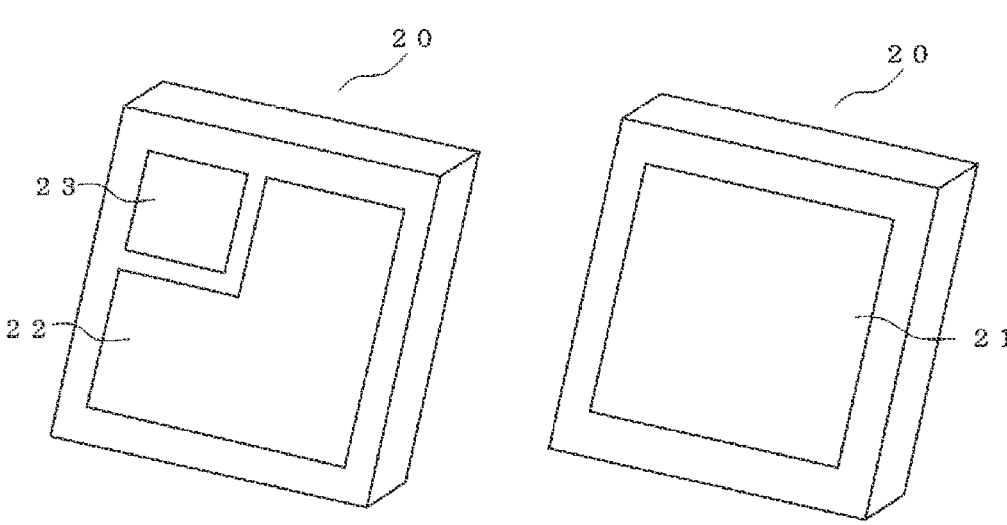
FIG. 15 provides perspective views of upper and lower surfaces of a semiconductor element.

FIG. 15 is a perspective view of upper and lower surfaces of the semiconductor element 20. The semiconductor element 20 is, for example, a vertical MOSFET and includes a drain electrode 21 formed on the lower surface and a source electrode 22 and a gate electrode 23 formed on the upper surface. A current is carried from the lower surface to the upper surface. The semiconductor element 20 is not limited to a MOSFET and may be an IGBT or the like. The semiconductor element 20 is formed from, for example, silicon (Si), silicon carbide (SiC), or gallium nitride (GaN). The drain electrode 21, the source electrode 22, and the gate electrode 23 are formed from, for example, aluminum (Al).

The drain electrode 21 is electrically connected to the bed portion 10 via the joint material 40.

Figure 3A:
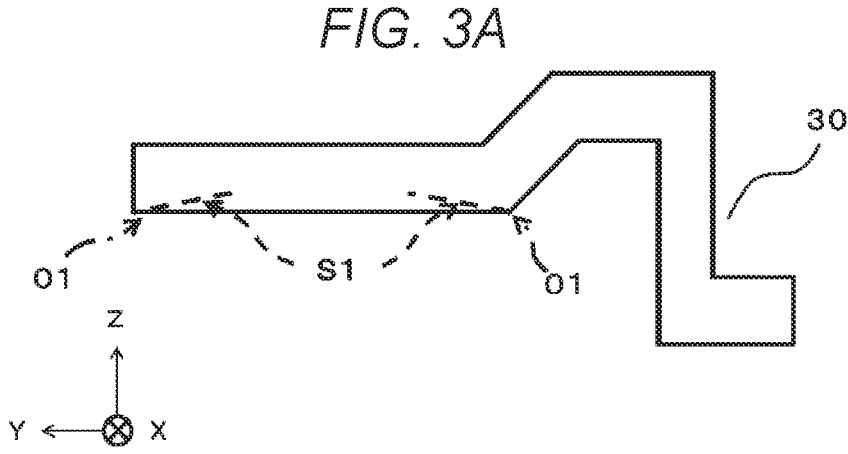
FIG. 3A is a cross-sectional view of a connector according to a first embodiment.
Figure 3B:
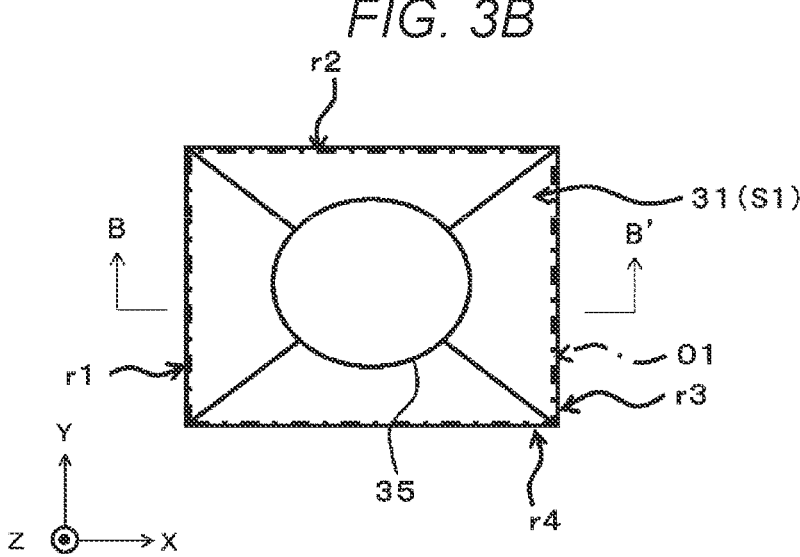
FIG. 3B is a plan view of a first connection portion according to a first embodiment.
Figure 3C:
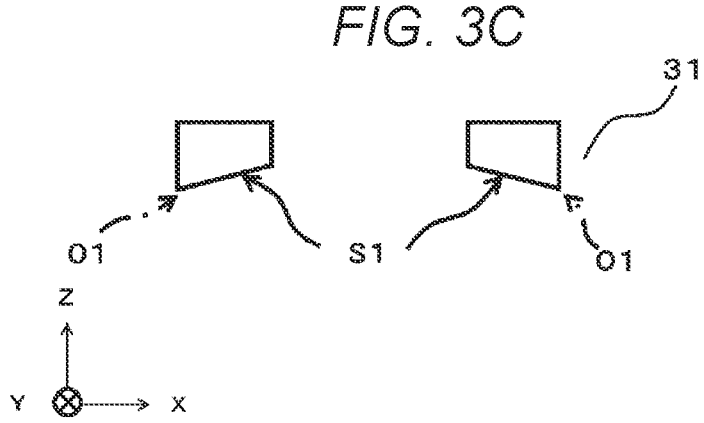
FIG. 3C is a cross-sectional view taken along line B-B' in FIG. 3B.

The connector 30 has a first connection portion 31, a second connection portion 32, and a lead portion 33. The connector 30 according to the first embodiment will be described with reference to FIGS. 1A to 3C. FIG. 3A is a cross-sectional view of the connector 30 according to the first embodiment, FIG. 3B is a plan view of the first connection portion 31 according to the first embodiment, and FIG. 3C is a cross-sectional view taken along line B-B' illustrated in FIG. 3B. For the convenience of description, an inclination of a lower surface S1 is indicated by a dashed line in FIG. 3A but by a solid line in FIG. 3B. Furthermore, in FIGS. 1A, 1B, and 2 (and FIGS. 5A to 10 as well) the first connection portion 31 is indicated by a dashed line, the second connection portion 32 is indicated by a dot-and-dash line, and the lead portion 33 is indicated by a double-dot-dashed line.

Figure 19:
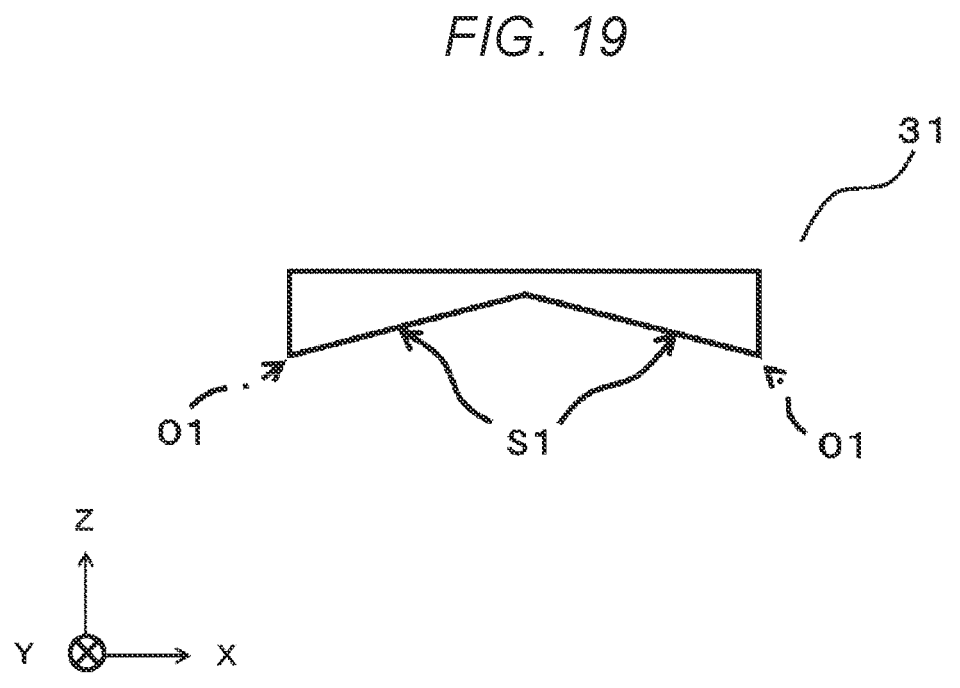

As illustrated in FIG. 3B, an outer periphery of a surface of the first connection portion 31 parallel to the X-Y plane is rectangular. The sides of the lower surface S1 of the first connection portion 31 parallel to the X-Y plane are referred to as sides r1, r2, r3, and r4. The sides r1 and r3 are parallel to the Y direction. The sides r2 and r4 are parallel to the X direction. A through via hole 35 is provided in the first connection portion 31 in the X-Y plane. The through via hole 35 penetrates the first connection portion 31 in the Z direction. As illustrated in FIG. 3C, the lower surface S1 of the first connection portion 31 has an inclination from an end portion toward a center in the Z direction. Specifically, the lower surface S1 of the first connection portion 31 has the inclination from the side r1 toward the through via hole 35. That is, a thickness in the Z direction of the first connection portion 31 closer to the side r1 in the X direction is greater than a thickness of the first connection portion 31 closer to the through via hole 35 in the X direction. Furthermore, the lower surface S1 of the first connection portion 31 has an inclination from the side r2 toward the through via hole 35 in the Z direction. That is, a thickness in the Z direction of the first connection portion 31 closer to the side r2 in the Y direction is greater than a thickness of the first connection portion 31 closer to the through via hole 35. Likewise, the lower surface S1 of the first connection portion 31 has an inclination from the sides r3 and r4 toward the through via hole 35 in the Z direction. If the through via hole 35 were not provided in the semiconductor device 100, the inclination of the lower surface S1 of the first connection portion 31 would be pyramid shaped, as illustrated in FIG. 19. As illustrated in FIGS. 3B and 3C, it is preferable that the inclination of the lower surface S1 of the first connection portion 31 is symmetrical.

For the convenience of description, it is defined that a point at which the inclination in the Z direction starts is a starting point O1. In the semiconductor device 100 according to the first embodiment, the starting point O1 is illustrated as matching with each side of the lower surface S1 of the first connection portion 31. However, as illustrated in FIGS. 4A to 4C, the present embodiment can be carried out even when the starting point O1 is provided between a region of the lower surface S1 apart from each side of the lower surface S1 and the through via hole 35.

Figure 4A:
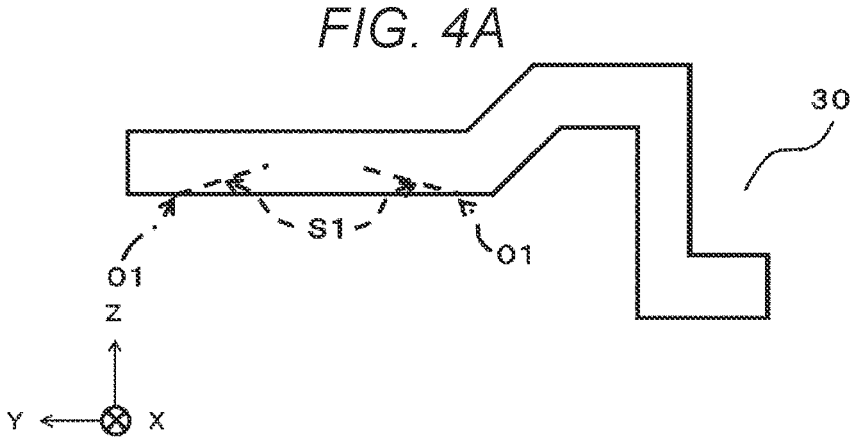
FIG. 4A is a cross-sectional view of a connector according to a modification of a first embodiment.
Figure 4B:
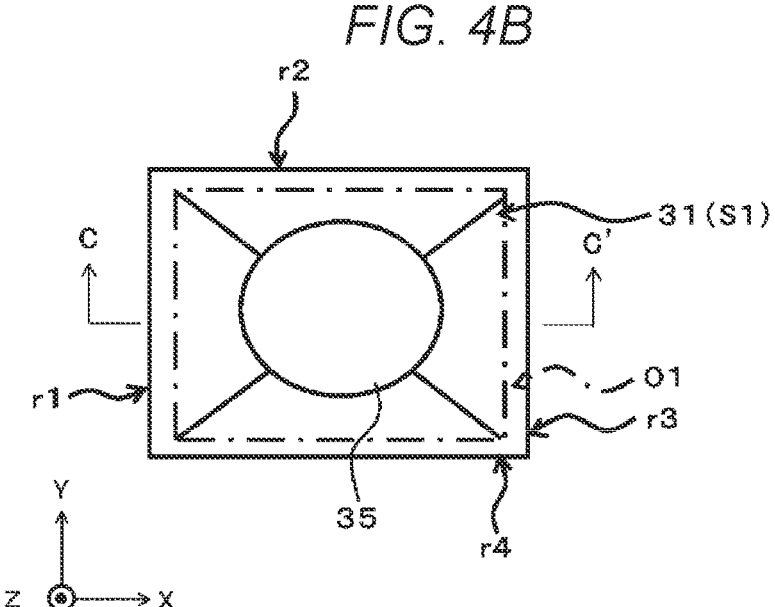
FIG. 4B is a plan view of a first connection portion according to a modification of a first embodiment.
Figure 4C:
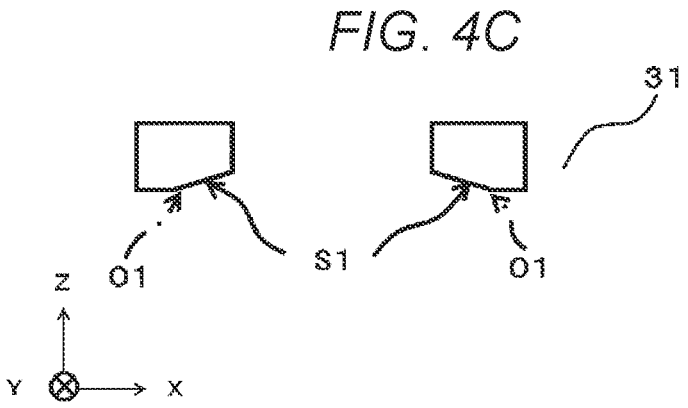
FIG. 4C is a cross-sectional view taken along line C-C' in FIG. 4B.

FIG. 4A is a cross-sectional view of the connector 30 according to a modification of the first embodiment, FIG. 4B is a plan view of the first connection portion 31 according to this modification of the first embodiment, and FIG. 4C is a cross-sectional view taken along line C-C' illustrated in FIG. 4B. The connector 30 according to this modification of the first embodiment is identical in configurations to the connector 30 according to the first embodiment except that the starting point O1 is provided in the region apart from the side (outer edge) of the lower surface S1.

The inclination in the Z direction on the lower surface S1 of the first connection portion 31 is formed, for example, by pressing of a metal plate.

As illustrated in FIG. 2, the second connection portion 32 has one end (first end 321) and another end (second end 322) in the Y direction. The connector 30 has a plurality of lead portions 33. The lead portions 33 are electrically connected to the first connection portion 31 via the second connection portion 32. Specifically, the first end 321 of the second connection portion 32 is formed integrally with the side r3 of the first connection portion 31, and the second end 322 of the second connection portion 32 is formed integrally with first ends 331 of each lead portion 33. That is, the first connection portion 31, the second connection portion 32, and the lead portions 33 are formed integrally (e.g., as a single metal member). In FIG. 2, a lower surface of the bed portion 10 and a lower surface of the second end 332 of each lead portion 33 are illustrated as being on the same plane. However, as illustrated in FIG. 16, the present embodiment can be carried out even when the lower surface of the second end 332 one or more of the lead portions 33 is below the lower surface of the bed portion 10. In FIGS. 2 and 3A, the second end 322 of the second connection portion 32 and first end 331 of each lead portion 33 are illustrated as being formed integrally (e.g., a single piece of bent metal or the like). However, as illustrated in FIG. 17, the present embodiment can be carried out even when the second end 322 of the second connection portion 32 is separate from the first end 331 of the lead portion 33 but electrically connected to the first end 331 by joint material 40.

The semiconductor device 100 according to the first embodiment has separate connectors 30 connected to the source electrode 22 and the gate electrode 23 of the semiconductor element 20, respectively. In the present embodiment, two connectors 30 are provided. The lower surface S1 of the first connection portion 31 of one of these connectors 30 is electrically connected to the source electrode 22 via the joint material 40.

The lower surface S1 of the first connection portion 31 of the other of these connectors 30 is electrically connected to the gate electrode 23 via the joint material 40. It is noted that the present embodiment can be carried out even if the lower surface S1 of the first connection portion 31 of the connector electrically connected to the gate electrode 23 is not inclined in the direction from the end portion to the center and is flat in the X-Y plane. The connectors 30 are formed from, for example, copper. The joint material 40 is, for example, a solder.

The resin 50 covers at least part of the bed portion 10, the semiconductor element 20, and the connectors 30. Specifically, the lower surface of the bed portion 10 and the lower surfaces of the second ends 332 of the lead portions 33 are exposed to the outside of the resin 50 and available as terminals to be connected to an external power supply or the like. For example, an epoxy resin is used as the resin 50.

(Method for Manufacturing Semiconductor Device 100)

Next, a method for manufacturing the semiconductor device 100 according to the first embodiment will be described with reference to FIGS. 5A to 5C. FIGS. 5A to 5C are cross-sectional views illustrating aspects of the method for manufacturing the semiconductor device 100 according to the first embodiment.

First, as illustrated in FIG. 5A, the joint material is coated on the bed portion 10, and the semiconductor element is mounted so that joint material 40 contacts the drain electrode 21 on the lower surface of the semiconductor element Joint material 40 is also coated on the source electrode 22 and the gate electrode 23 on the upper surface of the semiconductor element 20, and the connectors 30 are mounted so that the joint material 40 contacts the lower surfaces S1 of the first connection portions 31 of the connectors 30.

Subsequently, a reflow process furnace is heated to melt the joint material 40. The joint material 40 thereby spreads in the X-Y plane when melted. At this time, as illustrated in FIG. 5B, the surplus joint material 40 enters into the through via hole 35. The reflow process furnace is then cooled down. As illustrated in FIG. 5C, the joint material 40 is now fixed to electrically connect the bed portion 10 to the drain electrode 21 of the semiconductor element 20. Likewise, the source electrode 22 and the gate electrode 23 of the semiconductor element 20 are electrically connected to the connectors 30.

Finally, the resin 50 is applied (molded) to encapsulate at least part of the bed portion 10, the semiconductor element 20, and the connectors 30. At this time, at least part of the lower surface of the bed portion 10 and the lower surfaces of the second ends 332 of the lead portions 33 of the connectors 30 are left exposed outside of the resin 50. The semiconductor device 100 is formed through these processes.

Effects of First Embodiment

Figure 6:
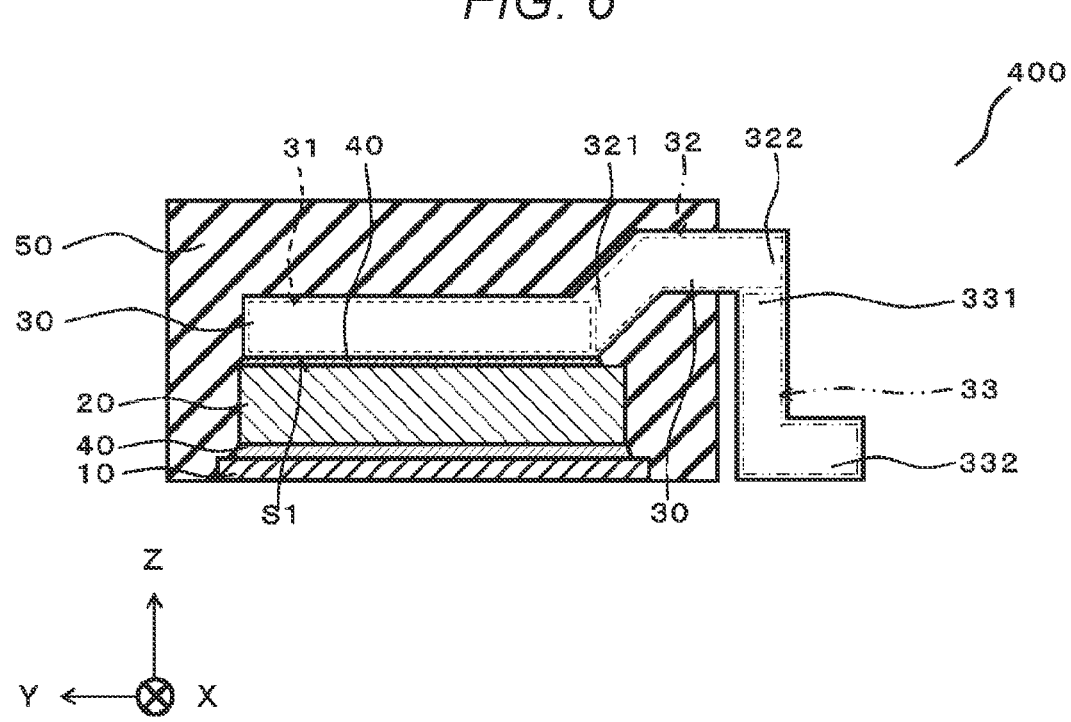
FIG. 6 is a cross-sectional view of a semiconductor device according to a first comparative example.
Figure 7:
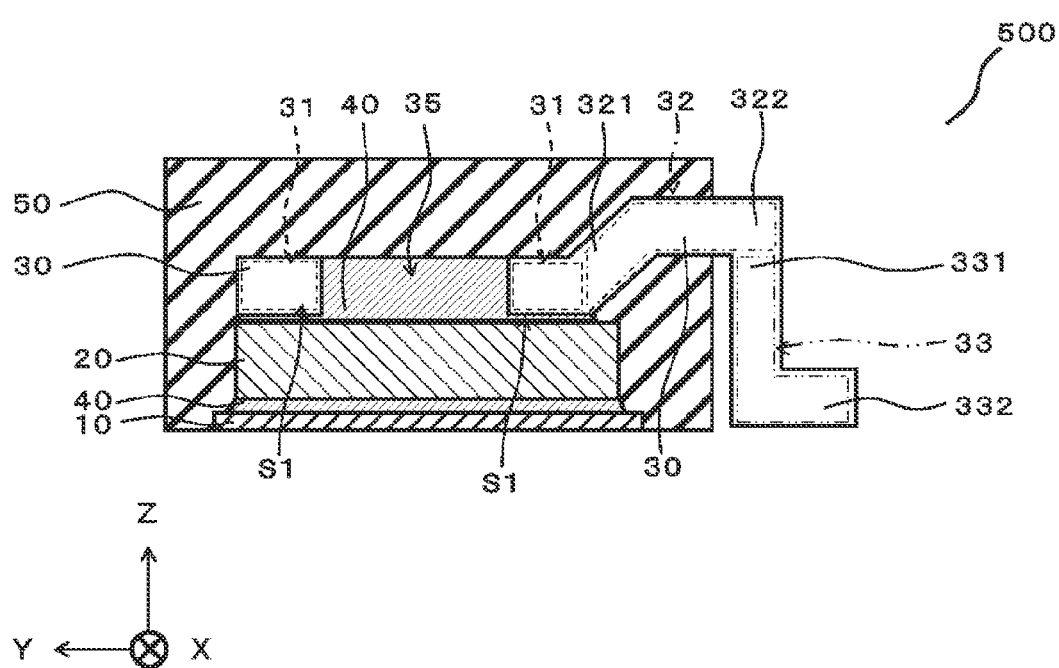
FIG. 7 is a cross-sectional view of a semiconductor device according to a second comparative example.

Effects of the semiconductor device 100 according to the first embodiment will be described while referring to certain semiconductor devices 400 and 500 of first and second comparative examples. FIG. 6 is a cross-sectional view of the semiconductor device 400 according to a first comparative example, and FIG. 7 is a cross-sectional view of the semiconductor device 500 according to a second comparative example.

The semiconductor device 400 according to the first comparative example differs from the semiconductor device 100 according to the first embodiment in that the lower surface S1 of the first connection portion 31 of each connector 30 is not inclined in the Z direction and the through via hole 35 is also not provided. That is, the lower surface S1 of the first connection portion 31 is flat in the X-Y plane. In the semiconductor device 400, when a distance between the outer periphery of the first connection portion 31 of each connector 30 and an outer periphery of the semiconductor element 20 in the X or Y direction is small, the joint material 40 between the semiconductor element 20 and the connector 30 may protrude from the outer periphery of the semiconductor element 20 during manufacturing of the semiconductor device 400. Contact between the protruding joint material 40 and the bed portion 10 causes short-circuit, resulting in the disablement of the semiconductor device 400.

Figure 8:
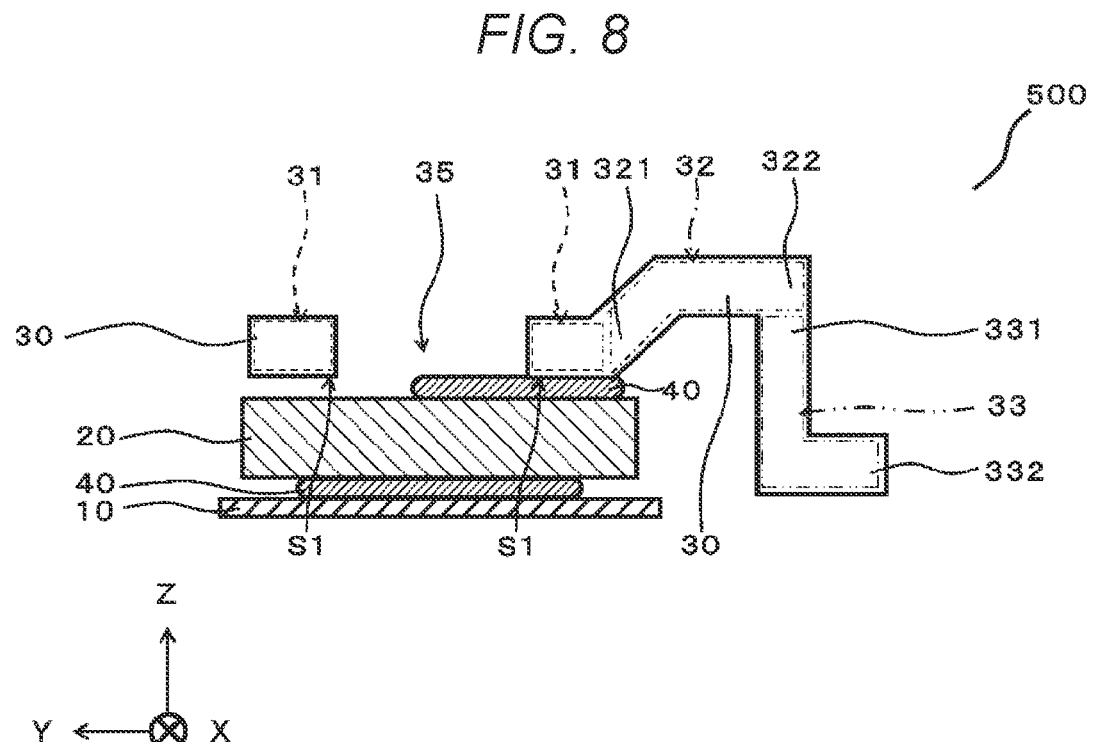
FIG. 8 is a cross-sectional view illustrating aspects of a method for manufacturing a semiconductor device according to the second comparative example.

The semiconductor device 500 according to the second comparative example differs from the semiconductor device 400 in that a through via hole 35 is provided in the first connection portion 31 of each connector 30. The surplus joint material 40 thus can enter into the through via hole 35 during the manufacturing of the semiconductor device 500. This can prevent the joint material 40 from protruding from the outer periphery of the semiconductor element 20. However, as illustrated in FIG. 8, during manufacturing of the semiconductor device 500, when a center of the through via hole 35 is badly misaligned (offset) from a center of the joint material 40 coated on the upper surface of the semiconductor element 20, the joint material 40 may spread insufficiently in the X-Y plane when the joint material 40 is melted. As a result, joint material 40 may not contact some part of the lower surface S1 of the first connection portion 31. This causes a reduction in conductivity in the semiconductor device 500, leading to degradation in electrical characteristics of the semiconductor device 500. Furthermore, when the joint material spreads insufficiently in the X-Y plane and the source electrode 22 provided on the upper surface of the semiconductor element 20 is left exposed from the through via hole 35 to the resin 50, water may penetrate to the source electrode 22 from outside and the source electrode 22 may corrode. This may eventually destroy the semiconductor device 500.

Figures 9A, 9B:
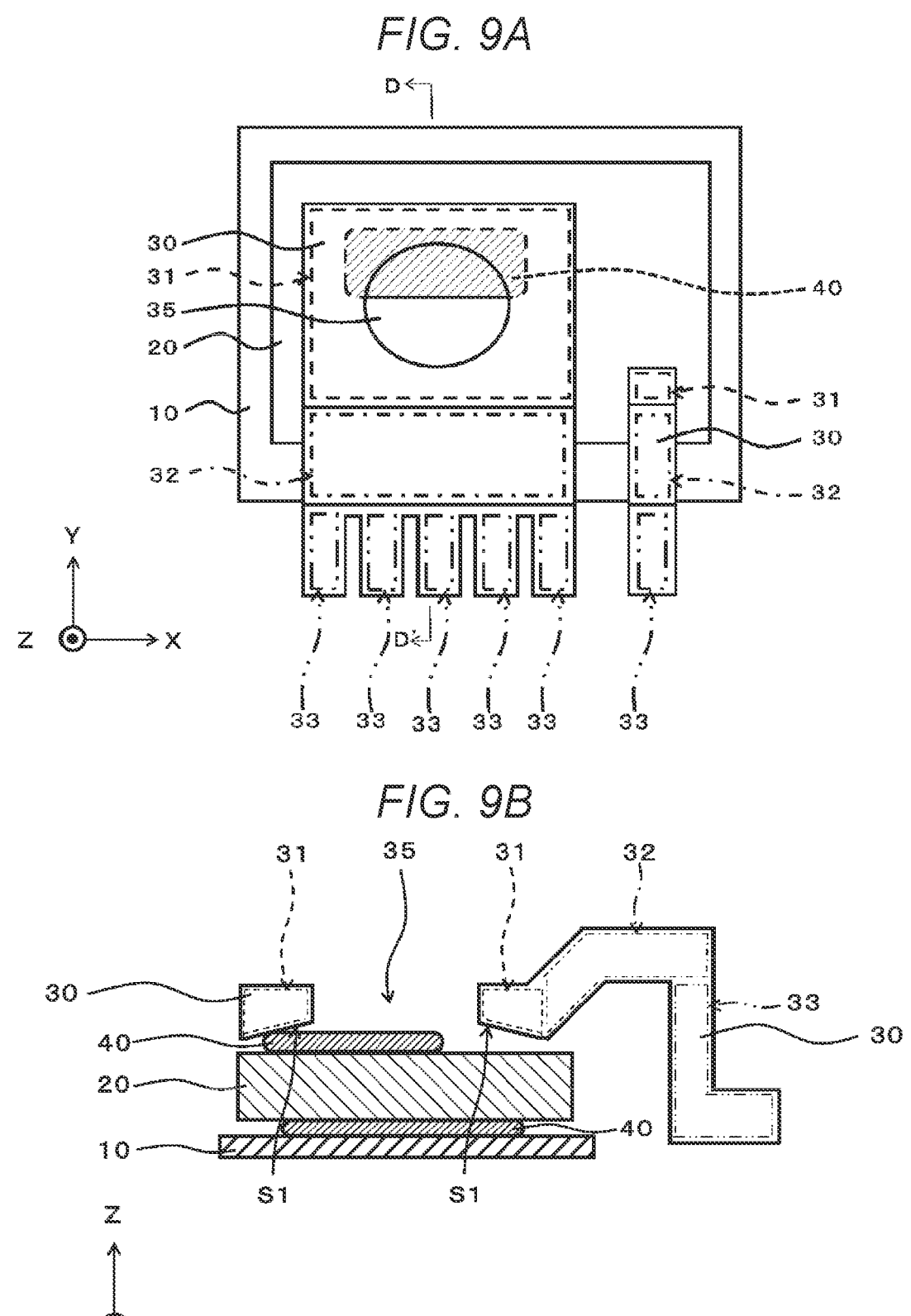
FIG. 9A illustrates a semiconductor device according to a first embodiment during the manufacturing process.
FIG. 9B is a cross-sectional view taken along line D-D' in FIG. 9A.
Figure 10:
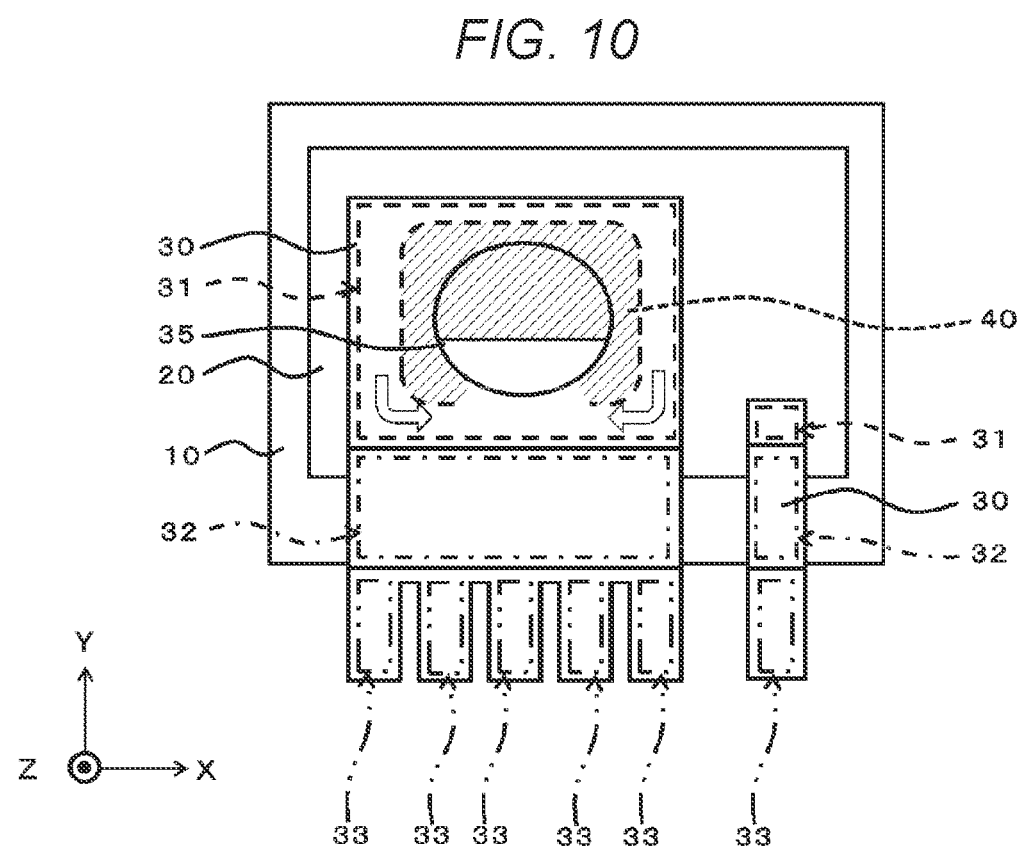

The effects of the semiconductor device 100 according to the first embodiment will be described with reference to FIGS. 9A, 9B, and 10. FIGS. 9A and 10 illustrate the semiconductor device 100 according to the first embodiment in the process of being manufactured. FIG. 9B is a cross-sectional view taken along line D-D' of FIG. 9A. It is noted that FIGS. 9A and 9B illustrate a case where the center of the through via hole 35 is badly misaligned (offset) from the center of the joint material 40 coated on the upper surface of the semiconductor element 20. In the semiconductor device 100 according to the first embodiment, the lower surface S1 of the first connection portion 31 of each connector 30 is inclined toward the through via hole 35. When the reflow process furnace is heated to melt the joint material the joint material 40 spreads along the inclination of the lower surface S1 of the first connection portion 31, as illustrated in FIG. 10. This increases the contact area between the lower surface S1 of the first connection portion 31 and the joint material 40. Therefore, it is possible to improve the conductivity and prevent the penetration of the water from outside to the source electrode 22, thus reducing the degradation in the electrical characteristics of the semiconductor device 100 and improving the lifetime of the semiconductor device 100. The uniform contact between the lower surface S1 of the first connection portion 31 and the joint material 40 also better enables dispersion and dissipation of heat generated during the use of the semiconductor device 100. Therefore, it is possible further to improve the lifetime of the semiconductor device 100. Furthermore, by providing the inclination on the lower surface S1 of the first connection portion 31 the thickness of the joint material 40 between the semiconductor element 20 and the first connection portion 31 in the Z direction can be increased. This can prevent cracking and peeling of the joint material 40 when an external force is exerted on the semiconductor device 100, thus improving the lifetime of the semiconductor device 100.

The semiconductor device 100 according to the first embodiment can contribute to improved device yield, compensate for the misalignment between the center of the first connection portion 31, i.e., the center of the through via hole 35 and the center of the joint material 40, and have other beneficial effects with regard to manufacturing efficiency and tolerances.

Moreover, as illustrated in FIGS. 3B and 3C, it is preferable that the inclination of the lower surface S1 of the first connection portion 31 in the Z direction is symmetric. The symmetric inclination of the lower surface S1 facilitates the uniform spread of the joint material 40 through the lower surface S1 of the first connection portion 31.

Modification of First Embodiment

Figures 11A, 11B:
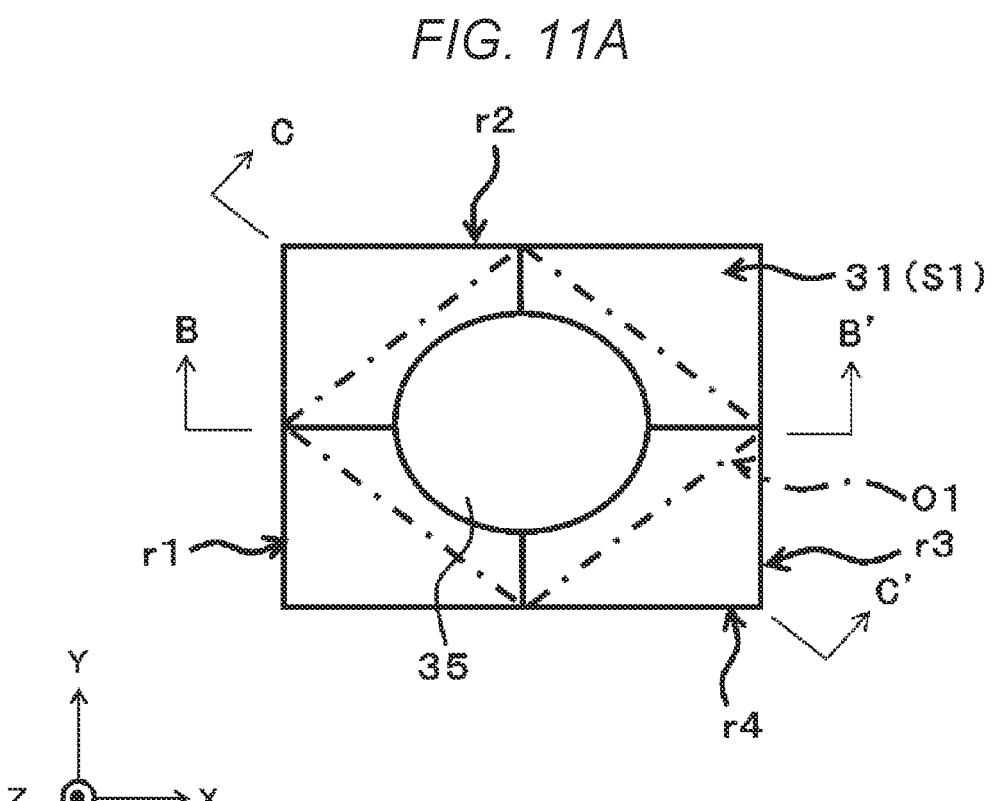
FIGS. 11A and 11B are plan views of a first connection portion according to a modification of a first embodiment.

A semiconductor device according to a modification of the first embodiment will be described with reference FIGS. 11A and 11B. FIG. 11A is a cross-sectional view of the first connection portion 31 used in the semiconductor device according to one modification of the first embodiment.

The semiconductor device according to this modification of the first embodiment differs in that the starting point O1 of the inclination provided on the lower surface S1 of the first connection portion 31 of the connector 30 is rotated by 45 degrees on the X-Y plane. In other words, the starting point O1 is located on each of the sides r1, r2, r3, and r4. It is noted that the cross-sectional view taken along line B-B' of FIG. 11A corresponds to FIG. 3C and the cross-sectional view taken along line C-C' of FIG. 11A corresponds to FIG. 4C. Other aspects of this modification are otherwise the same as the semiconductor device 100 according to the first embodiment.

In the semiconductor device according to this modification of the first embodiment, when the reflow process furnace is heated to melt the joint material 40, the joint material 40 spreads along the inclination of the lower surface S1 of the first connection portion 31 in a manner similar to already described for the unmodified first embodiment. This can increase the contact area between the lower surface S1 of the first connection portion 31 and the joint material 40, thus reducing the degradation in the electrical characteristics of the semiconductor device and improve the lifetime of the semiconductor device.

It is noted that the starting point O1 of the inclination provided on the lower surface S1 of the first connection portion 31 of the connector 30 may be applied even with a circular style inclination, as illustrated in FIG. 11B. If the through via hole 35 were not provided in the semiconductor device 100, the inclination on the lower surface S1 of the first connection portion 31 in the Z direction would be conical, as illustrated in FIG. 19. In any event, the semiconductor device 100 according to these modifications of the first embodiment can obtain similar effects to those of the unmodified semiconductor device 100 according to the first embodiment.

Second Embodiment

Figure 12A:
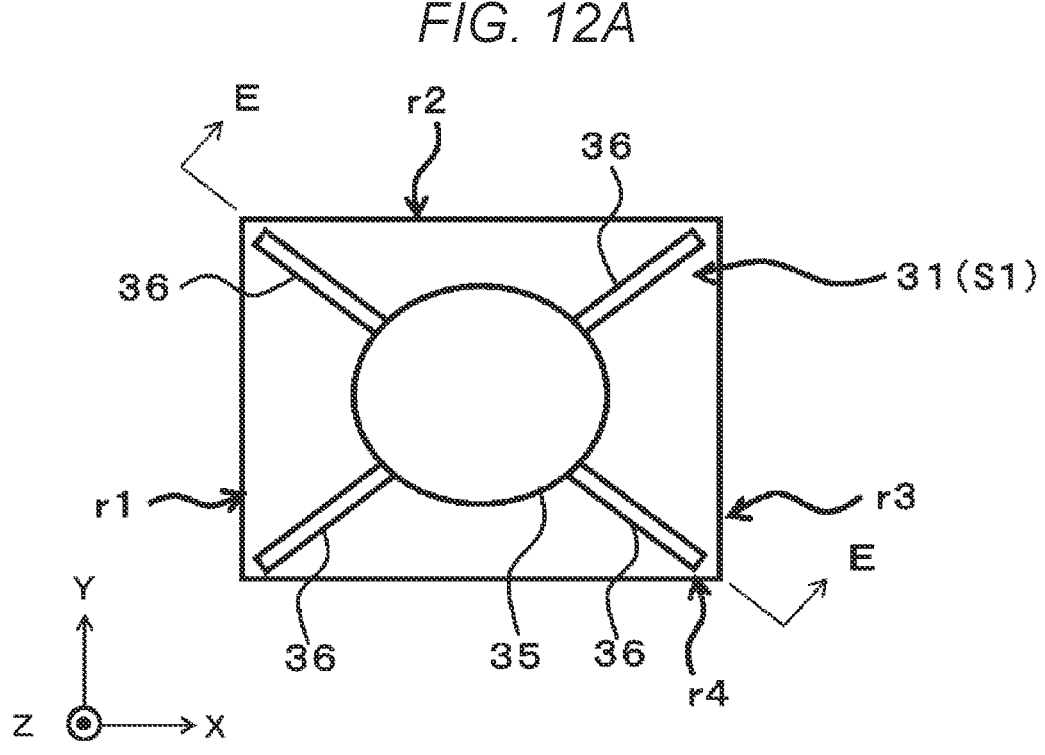
FIG. 12A is a plan view of a first connection portion according to a second embodiment.

A semiconductor device according to a second embodiment will be described with reference to FIGS. 12A and 12B. FIG. 12A is a plan view of the first connection portion 31 used in the semiconductor device according to the second embodiment, and FIG. 12B is a cross-sectional view taken along line E-E' of FIG. 12A.

The semiconductor device according to the second embodiment differs from the semiconductor device 100 according to the first embodiment in that a plurality of groove portions 36 are provided on the lower surface S1 of the first connection portion 31 of each connector 30. More specifically, the groove portions 36 are formed from the sides or corners of the lower surface S1 toward the through via hole 35. Aspects which are otherwise the same as the semiconductor device 100 according to the first embodiment will not be described separately for the second embodiment.

In the semiconductor device according to the second embodiment, when the reflow process furnace is heated to melt the joint material 40, the joint material 40 spreads along the groove portions 36 on the lower surface S1 of the first connection portion 31. This can increase the contact area between the lower surface S1 of the first connection portion 31 and the joint material 40, thus reducing the degradation in the electrical characteristics of the semiconductor device and improving the lifetime the semiconductor device.

Figure 12B:
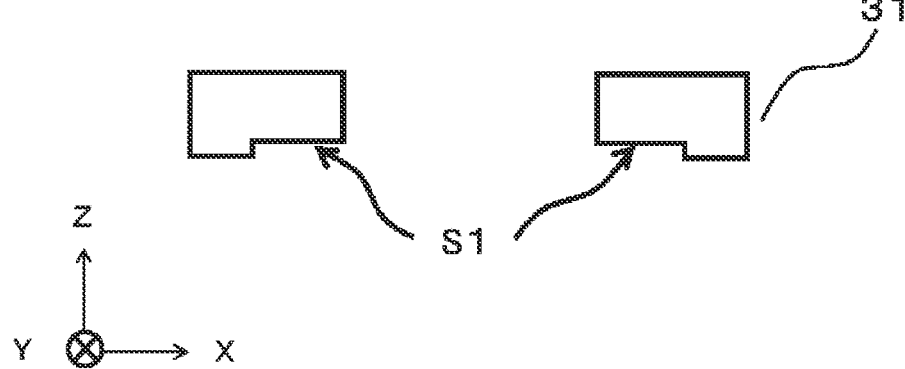
FIG. 12B is a cross-sectional view taken along line E-E' in FIG. 12A.
Figure 13:
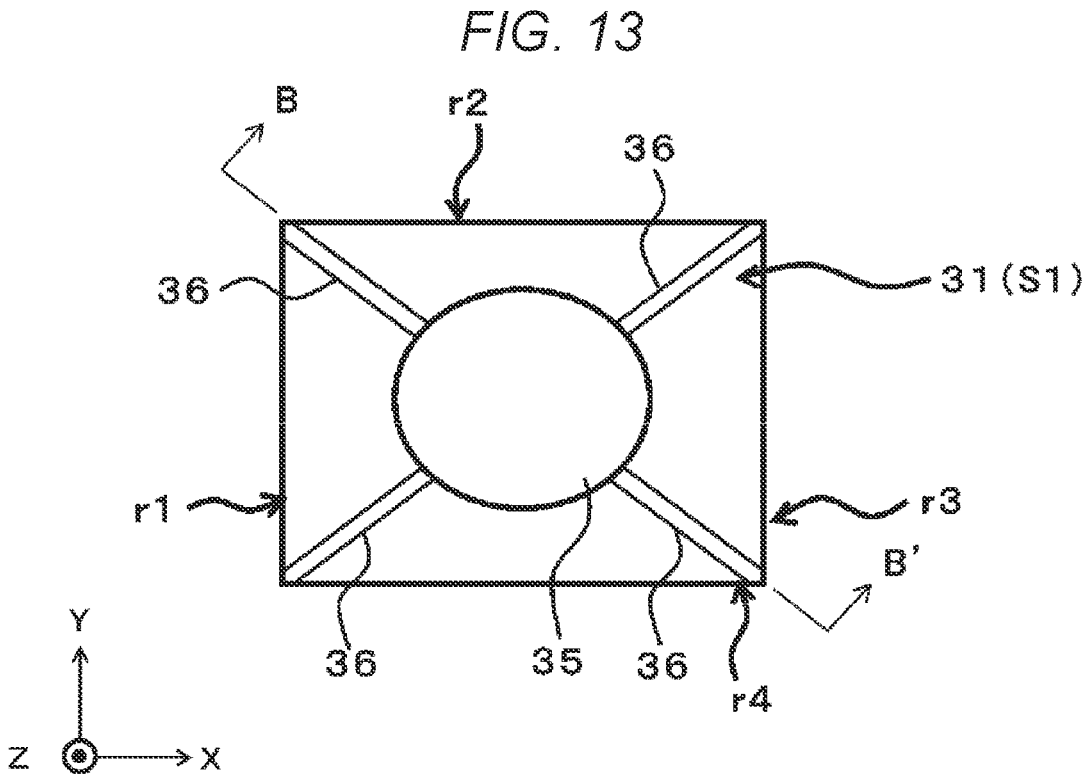
FIG. 13 is a plan view of a first connection portion according to a modification of a second embodiment.

In FIGS. 12A and 12B, the ends of groove portions 36 and the corners of the first connection portion 31 are illustrated as being apart. However, as illustrated in FIG. 13, the second embodiment can be carried out even if the groove portions 36 reach to the corners of the first connection portion 31. From the viewpoint of increasing the contact area between the lower surface S1 of the first connection portion 31 and the joint material 40, it is generally preferable that the groove portions 36 are longer, thus groove portions 36 that are extend all the way to the corners of the first connection portion 31 may be consider advantageous in some examples.

In FIGS. 12A and 12B, four groove portions 36 are illustrated. However, the second embodiment can be carried out with one or more groove portions 36. Like the semiconductor device 100 according to the first embodiment, the inclination on the lower surface S1 is symmetric so that the joint material 40 can spread uniformly through the lower surface S1 of the first connection portion 31.

In FIGS. 12A and 12B, the groove portions 36 are illustrated as being formed from the corners of the first connection portion 31 toward the through via hole 35. However, the present disclosure is not limited to this example and the groove portions 36 can be formed from the sides r1, r2, r3, and r4 of the lower surface S1 toward the through via hole 35 rather than from the corners.

Figure 14:
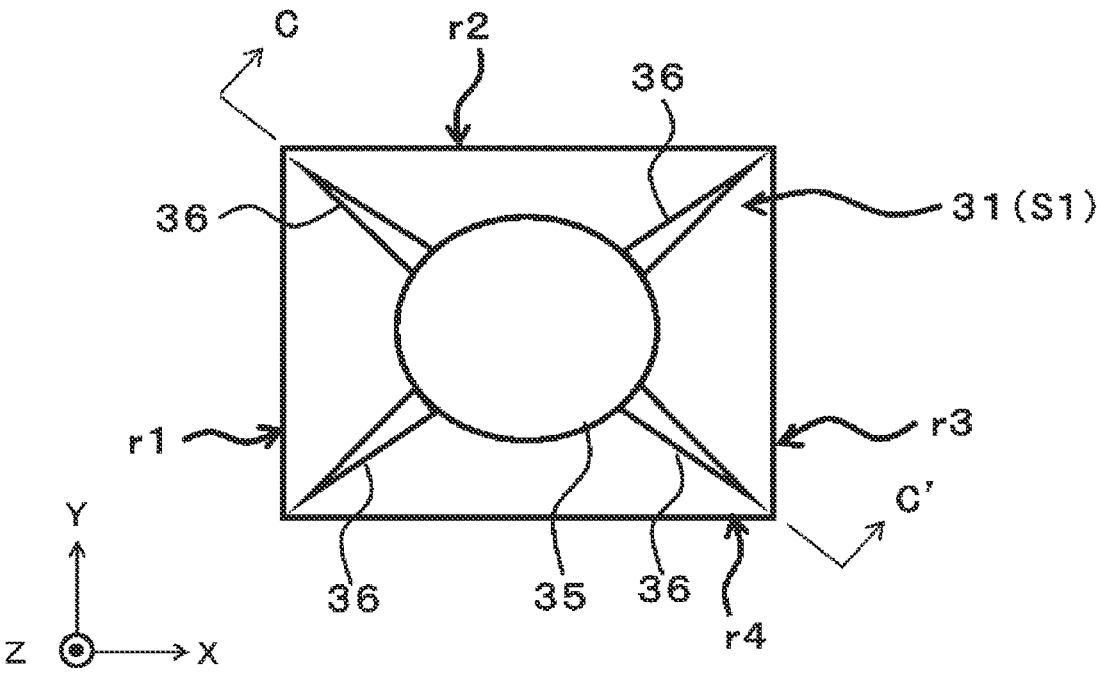
FIG. 14 is a plan view of a first connection portion according to a modification of a second embodiment.

Furthermore, in FIG. 12A, the groove portions 36 are illustrated as being rectangular in the X-Y plane. However, as illustrated in FIG. 14, the groove portions 36 can be triangular (or other shapes) in the X-Y plane. The semiconductor device according to these modification of the second embodiment can still obtain similar effects to those of the semiconductor device 100 according to the first embodiment.

Modification of Second Embodiment

Figure 18A:
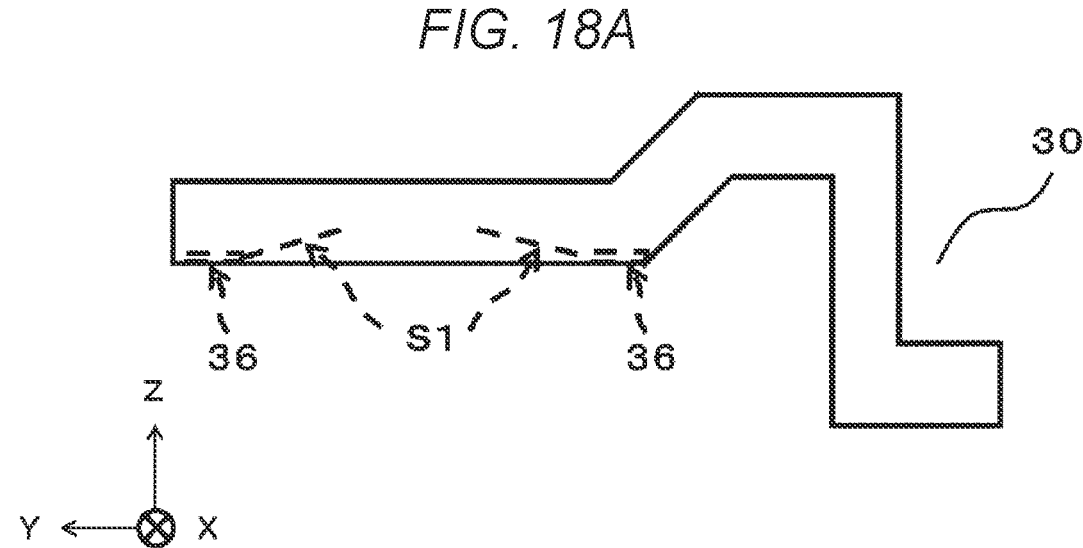
FIG. 18A is a cross-sectional view of a connector according to a modification of a second embodiment.
Figure 18B:
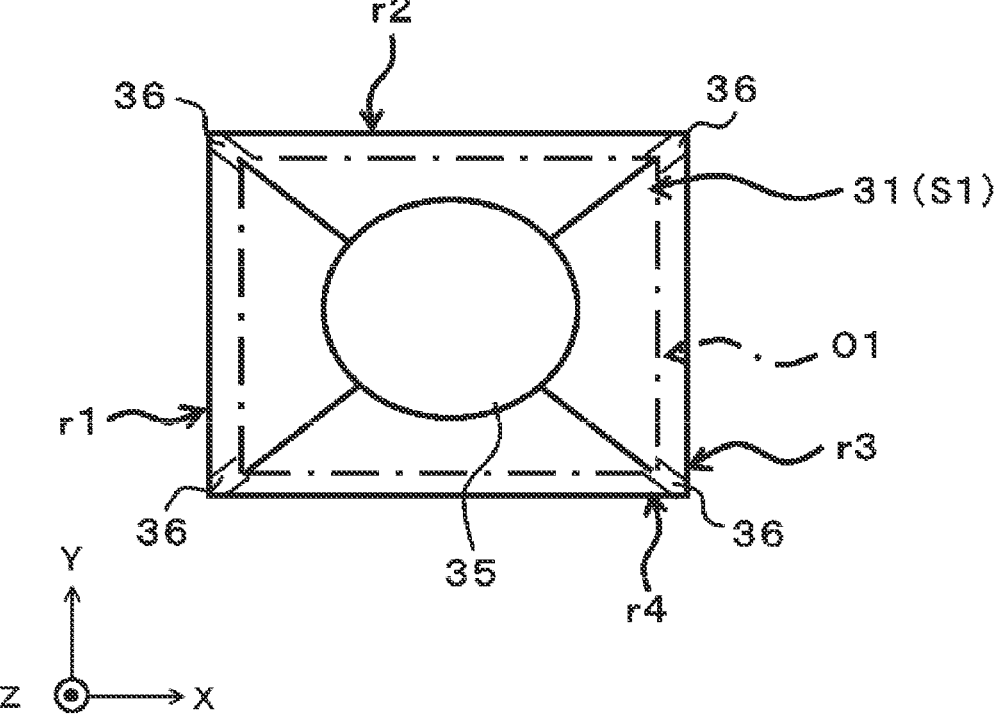
FIG. 18B is a plan view of a first connection portion according to a modification of a second embodiment.

A semiconductor device according to another modification of the second embodiment will be described with reference to FIGS. 18A and 18B. FIG. 18A is a cross-sectional view of the first connection portion 31 used in the semiconductor device according to this modification of the second embodiment. FIG. 18B is a plan view of the first connection portion 31 used in the semiconductor device according to this modification of the second embodiment.

For the convenience of depiction, the inclination and the groove portions 36 provided on the lower surface S1 are indicated by dashed lines in FIG. 18A.

The semiconductor device according to this modification of the second embodiment has a plurality of groove portions 36 on the lower surface S1 of the first connection portion 31 of each connector 30.

In the semiconductor device according to this modification, when the reflow process furnace is heated to melt the joint material 40, the joint material 40 spreads along the inclination and the groove portions 36 on the lower surface S1 of the first connection portion 31. This can increase the contact area between the lower surface S1 of the first connection portion 31 and the joint material 40, thus reducing the degradation in the electrical characteristics of the semiconductor device and improve the lifetime of the semiconductor device.

The groove portions 36 can be replaced by triangular groove portions 36, as illustrated in FIG. 14, in other examples.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor device, comprising:
a bed portion;
a semiconductor element including:
a first electrode electrically connected to the bed portion, and
a second electrode on a side of the semiconductor element opposite of the first electrode in a first direction; and
a connector including:
a first connection portion having a first surface electrically connected to the second electrode and a second surface opposite of the first surface, the first surface being at an upward incline from an outer portion towards a center of the first surface, and the second surface being a planar surface parallel to the second electrode, and
a lead portion electrically connected to the first connection portion and separated from the bed portion, wherein
the first surface has a pyramidal shape.

2. The semiconductor device according to claim 1, wherein a through via hole penetrates the first connection portion in the first direction.

3. The semiconductor device according to claim 1, wherein the first surface has a groove along a direction from the outer portion toward the center of the first surface.

4. The semiconductor device according to claim 1, wherein the connector further includes a second connection portion that electrically connects the first connection portion to the lead portion.

5. The semiconductor device according to claim 4, wherein the second connection portion is connected to the lead portion by solder.

6. The semiconductor device according to claim 1, wherein the bed portion is metal.

7. A semiconductor device, comprising:
a bed portion;
a lead frame connector having a first connection portion above the bed portion in a first direction and a lead-out portion that is spaced from the bed portion in a second direction intersecting the first direction; and
a semiconductor element having a first surface side soldered to the bed portion and a second surface side soldered to the first connection portion, the semiconductor element including:
a first electrode soldered to the bed portion, and
a second electrode on the second surface side and soldered to the first connection portion, the second electrode being electrically connected to the lead-out portion via the first connection portion, wherein
the first connection portion has a first surface facing the semiconductor element and a second surface facing away from the semiconductor element,
the first surface has a rectangular outer shape,
the first surface has a groove portion extending in a second direction from an outer corner portion of the rectangular outer shape of the first surface toward a center of the first surface,
the second surface is parallel to the second surface side of the semiconductor element, and
an upper surface of the groove portion is parallel to the second surface.

8. The semiconductor device according to claim 7, wherein a through via hole penetrates the first connection portion in the first direction.

9. The semiconductor device according to claim 8, wherein the through via hole is at the center of the first surface.

10. The semiconductor device according to claim 7, wherein the groove portion is rectangular in shape.

11. The semiconductor device according to claim 7, wherein the groove portion is triangular in shape.

12. The semiconductor device according to claim 7, wherein the first surface of the first connection portion has a portion that is inclined away from the semiconductor element.

13. The semiconductor device according to claim 7, wherein the first connection portion is soldered to the lead-out portion.

14. The semiconductor device according to claim 7, further comprising:

a resin covering the bed portion, the semiconductor element, the first connection portion, and at least a part of the lead-out portion.

15. A method for manufacturing a semiconductor device, comprising:

connecting a first electrode of a semiconductor element to a bed portion with solder;

connecting a first portion of a connector to a second electrode of the semiconductor element with solder; and heating the semiconductor element, the bed portion, the connector and the solder to fix the bed portion and the first connection portion of the connector to the semiconductor element, wherein the first portion of the connector has a first surface facing the second electrode and second surface opposite the first surface, the first surface is at an upward incline from an outer portion towards a center of the first surface, the second surface is a planar surface parallel to the second electrode, and the first surface has a groove portion extending in a direction from the outer portion towards the center of the first surface.

16. The method according to claim 15, wherein the first surface has a through via hole at the center.

17. The method according to claim 15, wherein the groove portion is rectangular in shape.

* * * * *